United States Patent [19]

Dunn et al.

[11] Patent Number: 4,855,002

[45] Date of Patent: Aug. 8, 1989

[54] PROCESS OF BONDING SURFACES EMPLOYING/ANAEROBIC ALUMINUM FILLED COMPOSITIONS

[75] Inventors: David J. Dunn, Twinsburg; Patrick P. Vano, Parma, both of Ohio; James P. Moran, Jr., Farmington, Conn.; Mark Holmes, Quaker Hill, Conn.; Elliott Frauenglass, Newington, Conn.

[73] Assignee: Loctite Corporation, Newington, Conn.

[21] Appl. No.: 297,416

[22] Filed: Jan. 13, 1989

Related U.S. Application Data

[63] Continuation of Ser. No. 63,256, Jun. 17, 1987, abandoned, which is a continuation of Ser. No. 458,999, Jan. 18, 1983, abandoned.

[51] Int. Cl.$^4$ .................... C08K 3/10; C08K 3/08; C08J 5/02
[52] U.S. Cl. .................. 156/307.3; 523/176; 524/430; 524/437; 524/441; 524/533; 524/853; 524/854; 156/314; 156/328; 156/330.9; 156/331.7; 156/332; 156/333
[58] Field of Search .............. 156/307.3, 314, 332, 156/333, 328, 331.7, 330.9; 524/430, 437, 441, 533, 853, 854; 523/176

[56] References Cited

U.S. PATENT DOCUMENTS

| | | | |
|---|---|---|---|
| 3,847,865 | 11/1974 | Duggins | 524/437 |
| 3,988,299 | 10/1976 | Malofsky | 526/262 |
| 4,019,922 | 4/1977 | Whittum et al. | 524/437 |
| 4,160,178 | 7/1979 | Smith et al. | 428/913 |
| 4,285,755 | 8/1981 | Piestert et al. | 156/307.3 |
| 4,309,334 | 1/1982 | Valitsky | 523/219 |
| 4,429,088 | 1/1984 | Bachmann | 525/213 |
| 4,432,829 | 2/1984 | Bachmann | 156/314 |
| 4,500,608 | 2/1985 | Rametta | 156/307.3 |
| 4,510,270 | 4/1985 | Okamoto et al. | 156/332 |
| 4,528,059 | 7/1985 | Janssen | 156/307.3 |
| 4,624,725 | 11/1986 | Lamm et al. | 524/906 |
| 4,631,325 | 12/1986 | Ray et al. | 326/220 |
| 4,722,960 | 2/1988 | Dunn et al. | 524/430 |

*Primary Examiner*—Herbert J. Lilling
*Attorney, Agent, or Firm*—Norman P. Soloway

[57] ABSTRACT

Polymerizable acrylic monomer adhesive systems comprising thirty to eighty percent by weight powdered aluminum filler material are disclosed. More specifically, the adhesive compositions comprise at least one polymerizable acrylate monomer system; an effective amount for initiation of a free radical initiator; and elemental (atomized) aluminum metal powder or powdered alumina.

24 Claims, No Drawings

PROCESS OF BONDING SURFACES EMPLOYING/ANAEROBIC ALUMINUM FILLED COMPOSITIONS

This is a continuation of co-pending application Ser. No. 63,256 filed on June 17, 1987, which is a Rule 60 continuation of Ser. No. 458,999 filed Jan. 18, 1983, both now abandoned.

BACKGROUND OF THE INVENTION

1. Field of the Invention

This invention relates to adhesive and sealant compositions having improved thermal conductivity and strength properties at elevated temperatures and resistance to thermal degradation. The compositions have particular utility for mounting heat generating electrical components to heat sinks and will be described in connection with such utility, although other uses such as structural bonding and as machinable filling are contemplated.

2. Prior Art

The increasing density of components on printed circuit assemblies and the use of higher-power components often necessitates the use of board or chassis mounted heat sinks. A heat sink is a thermally conductive component, usually metal, designed to radiate or conduct unwanted heat away from a heat generating electronic component in order to maintain the electronic component below a maximum acceptable operating temperature. A heat sink may be considered as a complete thermal system consisting of the heat generator and its mounting hardware, thermally conductive interfacing materials to bring the mounting surface of the component into intimate contact with a surface of the sink, and the thermal dissipater itself. For practical purposes the thermally conductive interfacing material generally is the weakest (thermal) link in a heat sink system.

Various thermally conductive interfacing materials are known in the art and are available commercially. Each has its advantages and disadvantages. One such type of prior art thermally conductive interfacing material comprises metal- or metal oxide-filled epoxy resin. Metal- or metal oxide-filled epoxy resins provide adequate coefficient of thermal conductivity ($K=1.255$ W/m °C.), good electrical insulation and high adhesive strength. Metal- or metal oxide-filled epoxy resins are available as two-component systems exhibiting relatively short working pot life or as one component systems requiring five to seven days at room temperature to cure, or they may be cured in one to three hours by heating to elevated temperature. However, heating at elevated temperature may damage heat sensitive electronic components. Moreover, metal- or metal oxide-filled epoxy resins shrink somewhat during cure. Accordingly, a buffer material must be placed around fragile electrical components to prevent fracturing from shrinkage. However, the imposition of a buffer material may adversely affect thermal conductivity characteristics.

Silicone greases also have been employed by the prior art as thermally conductive interfacing materials. Silicone greases provide coefficients of thermal conductivity of $K=0.20$ to $0.42$ W/m °C., and good electrical insulation. Silicone greases are able to sustain prolonged high temperature exposure which makes silicone resins the presently preferred thermal interfacing materials for use with high-heat dissipating components such as power transistors. However, silicone greases are relatively thick, making them somewhat difficult to apply. Moreover, silicone greases are not adhesives, and thus separate mechanical mounting hardware is required for securing the components to the sink. Additionally, silicone greases are known to migrate into electrical contacts such as switches, plug-in connectors, relay contacts and variable resistors. Also, silicone greases do not cure and thus may collect dirt which can contain metal and other conductive particles which could cause shorts.

As this is apparent from the above discussion, none of the currently available thermally conductive interfacing materials are completely satisfactory since all prior art thermally conductive interfacing materials at best are a tradeoff of preferred application characteristics, (i.e. processing speed, ease of application, pot life and cure conditions), preferred physical characteristics, (i.e. thermal conductivity characteristics and electrical properties and adhesive strength), and repairability.

It is thus a primary object of the present invention to provide an improved thermally conductive interfacing system, i.e. processes, materials and products which overcome the aforesaid and other disadvantages of the prior art.

Other objects of the present invention are to provide improved thermally conductive adhesive compositions for interfacing high-heat dissipating components and the like with heat sinks and the like which compositions demonstrate relatively high coefficients of thermal conductivity, extended pot life and ease of application, rapid dry-to-touch cure and dry fillets, good electrical properties, good adhesive strength at elevated temperatures, and ease of repairability. Yet other objects will in part appear obvious and will in part appear hereafter.

The invention accordingly comprises the processes involving the several steps and relative order of two or more of such steps with respect to each other, and the devices, materials, and compositions possessing the several features, properties and relations of elements which are exemplified in the following disclosure and scope of application of which will be indicated in the claims.

SUMMARY OF THE INVENTION

Generally, the foregoing and other objects of the invention are achieved by the provision of a thermally conductive adhesive composition comprising a polymerizable acrylic monomer system, a free radical initiator, powdered aluminum filler material in an amount equal to at least about thirty percent by weight of the total composition, and optionally a metal chelator. More specifically, the thermally conductive adhesive composition comprises:

(a) at least one polymerizable acrylate ester monomer system;

(b) an effective amount for initiation of a peroxide, hydroperoxide or other free radical initiator;

(c) powdered aluminum filler material in an amount of from about thirty percent (30%) to about eighty percent (80%) by weight of the total composition; and optionally (d) an effective amount for stabilization of the composition of a chelating component.

The invention also includes a method of sealing or bonding surfaces comprising applying to either or both of said surfaces the aluminum powder containing adhesive composition of this invention, placing said surfaces in abutting relationship and causing the composition to cure, as by application of a primer or exclusion of oxygen.

DETAILED DESCRIPTION OF THE INVENTION

A. The Polymerizable Acrylic Monomer System

The polymerizable acrylic monomer system may comprise mono-functional or a combination of mono- and polyfunctional acrylate ester monomers. Generally, the monomers are exemplified but not limited to those selected from the class consisting of alkyl acrylates, cycloalkyl acrylates, alkyl methacrylates, cycloalkyl methacrylates, alkoxy acrylates, alkoxy methacrylates, alkylene diacrylates and alkylene dimethyacrylates, aryl acrylates and aryl methacrylates. Among the preferred monofunctional monomers are methyl methacrylate, lauryl methacrylate, 2-ethyl hexyl methacrylate, ethyl methacrylate, n-butyl methacrylate, iso-butyl methacrylate, and t-butyl methacrylate. The most preferred are those monomers which have high boiling points and low volatility characteristics, including such monomers as tetrahydrofurfurl methacrylate, cyclohexyl methacrylate, isobornyl methacrylate, hydroxyethyl methacrylate, hydroxypropyl methacrylate, t-butylaminoethyl methacrylate, cumylphenyl methacrylate, 3-phenoxy-2-hydroxypropyl methacrylate and chloroethyl methacrylate.

The monofunctional monomers mentioned above may generally be represented by the formula:

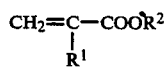

I.

wherein $R^1$ is H, $CH_3$ or lower alkyl, $R^2$ is H, alkyl, cycloalkyl, alkylene or aryl group.

It may be desirable to add a polyfunctional monomer to the composition as well. The preferred polyfunctionals are dimethacrylates of various glycols. These monomers are disclosed in U.S. Pat. No. 3,218,305, and are of the general formula:

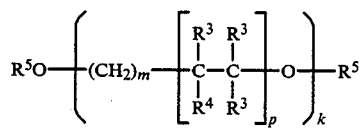

II.

wherein $R^3$ is H, $C_{1-4}$ alkyl or hydroxyalkyl or $R^5OCH_2$—; $R^6$ is H, halogen or $C_{1-4}$ alkyl; $R^4$ is H, OH or $R^5O$—; $R^5$ is $CH_2=CR^6 \, C=O$—; m is an integer, preferably 1 to 8; k is an integer, preferably 1 to 20; and p is 0 or 1.

Examples of some preferred glycol dimethacrylates of this formula are polyethylene glycol dimethacrylate and dipropylene glycol dimethacrylate, and ethoxylated bis-phenol-A-dimethacrylate to name a few.

Other suitable polymerizable acrylate ester monomers which may be employed are described in U.S. Pat. No. 4,018,851, having the general formula:

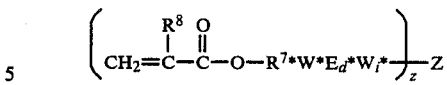

III.

wherein $R^8$ is selected from the class consisting of hydrogen, chlorine, and methyl and ethyl radicals; $R^7$ is a bivalent or organic radical selected from the group consisting of lower alkylene of 1–8 carbon atoms, phenylene, and naphthylene; W is a polyisocyanate radical; E is an aromatic, heterocyclic or cycloaliphatic polyol or polyamine radical, preferably a diol, and more preferably a diol of a cycloaliphatic compound; d is either 1 or 0; i is 0 when d is 0, and otherwise equal to one less than the number of reactive hydrogen atoms of E; wherein Z is a (i) polymeric or copolymeric grafted alkylene ether polyol radical or (ii) polymeric or copolymeric methylene ether polyol radical; z is an integer equal to the valency of Z; wherein an asterisk indicates a urethane (—NH—CO—O—) or ureide (—NH—CO—NH—) linkage. Z may also be a polymeric or copolymeric methylene ether polyol radical, giving a group of polymerizable monomers disclosed in U.S. Pat. No. 3,993,815.

Monomers generally characterized as polyurethanes or polyureides, as disclosed in U.S. Pat. No. 3,425,988, also may be used effectively. These monomers are formed from the reaction of an organic polyisocyanate and an acrylate ester having an active hydrogen in the non-acrylate portion of the ester. These monomers may be represented by the general formula:

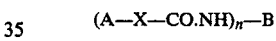

IV wherein X is —O— or —$R^9$N—; $R^9$ is selected from a group consisting of H or lower alkyls of 1 through 7 carbon atoms; A is $CH_2=CR^{10}.CO.O$—; $R^{10}$ is H or $CH_3$; n is an integer from 2 to 6 inclusive; and B is a polyvalent substituted or unsubstituted alkyl, alkenyl, cycloalkyl, aryl, aralkyl, alkyloxy-alkylene, aryloxy-arylene or heterocyclic radical.

Other useful acrylate ester monomers are the reaction products of di- or tri-alkylolamines (e.g., ethanolamines or propanolamines with acrylic acids, such as are disclosed in French Pat. No. 1,581,361.

Finally, polymerizable urethane acrylate monomers disclosed in U.S. patent application No. 356,679 to O'-Sullivan, filed May 2, 1973, now abandoned, particularly Example 3 thereof, may be employed. Typical monomers of this type have the general formula of:

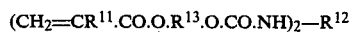

V wherein $R^{11}$ is H, $CH_3$, $C_2H_5$ or $C_1$; $R^{12}$ is $C_{2-20}$ alkylene, alkenylene or cycloalkylene radical or a $C_{6-40}$ arylene, alkarylene, aralkarylene, alkyloxyalkylene or aryloxyarylene radical which may be substituted by 1–4 chlorine atoms or by 1–3 amino or mono- or di-$C_{1-3}$ alkylamino or $C_{1-3}$ alkoxy groups. $R^{13}$ is one of the following less one hydrogen atom; (a) a $C_{1-8}$ hydroxy alkyl or aminoalkyl group, (b) a $C_{1-6}$ alkylamino-$C_{1-8}$ alkyl group; or (c) a hydroxyphenyl, an aminophenyl, a hydroxynaphthyl or an aminonaphthyl group which may be further substituted by an alkyk, alkylamino or dialkylamino group, each alkyl group in this subpart (c) containing up to about 3 carbon atoms. Of these, the preferred compositions contain either monomer VI., of formula:

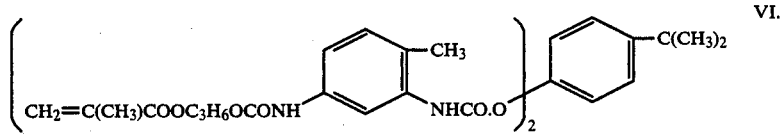

or monomer VII., of formula:

or both, (PR represents a propylene triol oligomer residue).

The effective range of the polymerizable acrylate ester monomer to be used in the instant compositions may vary somewhat depending on the specific properties desired, but generally 20 to 70% by weight of the total composition is desirable, and preferably within the range of 30 to 60% by weight thereof. Adjustments within these ranges are easily made within the skill of the art.

It also may be desirable to include at least one rubber compound or cure-to-rubber monomer in the acrylic monomer system. The rubber compound should be soluble in the acrylate ester monomers employed. The rubber compounds useful in the practice of the instant invention may be selected from a wide range of suitable materials. Most frequently these rubbers are either: (i) a homopolymer of alkyl esters of acrylic or methacrylic acid; (ii) a homopolymer of an alkoxy ester of acrylic or methacrylic acid; (iii) a copolymr of another polymerizable monomer, such as lower alkenes with an alkyl ester of acrylic or methacrylic acid, or with an alkoxy ester of acrylic or methacrylic acid; (iv) a methacrylate terminated moderate molecular weight chain; or (v) a mixture of any of all of the above (i)–(iv). Other unsaturated monomers which may be copolymerized with the alkyl and alkoxy esters of acrylic or methacrylic acid include dienes, reactive halogen-containing unsaturated compounds and other acrylic monomers such as acrylamides.

The choice of the rubber compound will, to a large degree, dictate various properties and characteristics of the adhesive composition and such choices are easily determined through general experimentation and known methods within the art. It is most effective to use acrylic rubbers whose molecular weight averages more than about 100,000, but any molecular weight greater than 5,000 would be suitable. It is also best to choose an acrylic rubber whose Mooney viscosity is between about 25 and about 60, and whose glass transition temperature (Tg) is 15° C. or less. The Mooney viscosity is defined as the amount of torque or resistance required to revolve a rotor at a constant speed in a polymer at a constant temperature. The Mooney viscosity of the preferred rubbers of the instant invention are described by the manufacturers as ML(1+4). The (1+4) symbol is to indicate the time involved in measuring the polymer viscosity. The "1" indicates a one-minute pre-heating time, which is to bring the rotor to the designated temperature. The "4" indicates that the torque reading is to be taken after four minutes of rotating the rotor. The readings are measured on a scale usually of 0–100. There are no specific units involved. However, these specific limitations are not absolute and various rubbers which do not fall within them may be within the scope of this invention.

One preferred group of rubber compounds consists of the copolymers of ethyl acrylate with 2-chloroethyl vinyl ether in the approximate molecular ratio of 95:5, respectively. One such acrylic rubber is manufactured by the B. F. Goodrich Company, and is marketed under the name Hycar 4021. Another preferred rubber is a copolymer of methyl acrylate and ethylene, manufactured by DuPont, under the name of Vamac N123. A third group of preferred rubbers is manufactured by American Cynamid and includes rubbers known as Cyanacryl R, Cyanacryl L and Cyanacryl C. Yet another preferred group of rubber compounds are the chlorosulfonated polyethylene synthetic rubbers available from DuPont under the name Hypalon (various numbers). The range of rubber compounds should be about 0 to about 50% by weight of the monomer system preferably about 5 to about 40% by weight.

The Hycar rubbers are high molecular weight rubbers, typically having a Mooney viscosity at 100° C. of between about 25 and 60 ML(1+4), and a glass transition temperature range of about $-15°$ C. to about $-40°$ C. Hycar 4021 has a Mooney viscosity of about 40 minimum and a glass transition temperature (Tg) of about $-15°$ C.

Vamac N123 has a Mooney viscosity of about 30 and a glass transition temperature (Tg) of about $-40°$ C. Cyanacryl R is reported to have a Mooney viscosity of between about 42 to about 51 and a glass transition temperature (Tg) of about $-18°$ C., while Cyanacryl L and C have Mooney viscosities between about 30–48 and glass transition temperatures of $-24°$ C. and $-32°$ C. respectively. This data has been procured from the manufacturers' technical literature.

Some of the above preferred rubber compounds are available as small chunks or moderate size powder and are suitable to direct solution by stirring in the monomer. Other rubber compounds are solid materials which must be masticated on a mill prior to dissolution in the acrylic ester monomers. Mastication aids the dissolution by breaking down the molecular weight and reducing the physical and chemical cross-links. Properties of the cured adhesive composition will vary somewhat with the degree of mastication, the effects of which may be determined with routine experimentation for any given rubber compound. These solid rubbers should show little or no sign of phase separating once fully dissolved in the monomer.

B. The Initiators

The initiator system comprises a free-radical initiator of the organic peroxy, hydroperoxy or other free radical initiator type. Included within this definition are materials such as organic peroxides or organic peresters which decompose to produce free radicals in situ. Examples of such peroxides and peresters are cyclohexyl hydroxycyclohexyl peroxide and t-butyl perbenzoate, respectively.

While the nature of the free radical initiator is not critical to the broad concept of this invention, the preferred organic peroxides and hydroperoxides can be represented by the formulas:

$$R^{14}OOR^{14} \qquad \text{VIII(A)}$$

and $$R^{14}OOH \qquad \text{VIII(B)}$$

wherein $R^{14}$ is a hydrocarbon group containing up to about 18 carbon atoms, and preferably is an alkyl, aryl or aralkyl hydrocarbon group containing from about 3 to about 12 carbon atoms. Naturally $R^{14}$ can contain any substituent or linkage, hydrocarbon or otherwise, which does not affect the peroxide or hydroperoxide adversely for the purpose disclosed herein. Typical examples of such organic peroxides are benzoyl peroxide, tertiary butyl peroxide, and tertiary butyl peroxybenzoate. Typical examples of such organic hydroperoxides are cumene hydroperoxide, tertiary butyl hydroperoxide, methylethylketone hydroperoxide, and hydroperoxides formed by oxygenation of various hydrocarbons such as methylbutene, cetane and cyclohexene and various ketones and ethers, including certain compounds represented by the general formula VIII(B) above. The free radical initiators which are used commonly comprise less than about 10 percent by weight of the combination of the polymerizable monomer and initiator and preferably comprise from about 0.1 percent to about 5 percent of the combination.

C. The Powdered Aluminum

A key feature of this invention is the use of powdered aluminum filler material. The powdered aluminum filler material may comprise one or a mixture of two types. The first type consists of elemental (so-called atomized) aluminum (metal) powder. Atomized aluminum metal powder is available commercially from a number of sources and is produced by high pressure jet ejection of high grade molten aluminum into hot air or steam. The presently preferred atomized aluminum metal powder is Aluminum 101 powder available from Alcoa Company, Pittsburgh, Pa. The manufacturer describes this product as comprising steam ejected aluminum metal particles of about 99.7% purity, and having a generally spherical particle shape and an average particle diameter of 17 to 24 microns. The particles are contained within a protective coating of aluminum oxide ($Al_2O_3$) of approximately 50 Å thickness which results from the atomization process.

The second type of powdered aluminum consists of high purity anhydrous aluminum oxide $Al_2O_3$ (alumina). High purity aluminum oxide is available commercially from a variety of sources. The aluminum oxide can be partially or wholly dehydrated, e.g., by heating the oxide to appropriate temperature in a manner well known in the art.

Useful compositions in accordance with the invention may comprise from about thirty to about eighty percent by weight powdered aluminum filler material, and preferably comprise from about fifty to about seventy percent by weight powdered aluminum filler material. It has been observed that thermal conductivity falls off drastically for compositions having less than about thirty percent by weight powdered aluminum, while at powdered aluminum concentrations in excess of about eighty percent adhesive (bond) strength of composition is insufficient for most intended uses. Also compositions containing in excess of about eighty percent by weight of powdered aluminum may exhibit unacceptable levels of electrical conductivity for certain purposes.

As is well known in the art, metal concentrations of one part per million or less may cause spurious polymerization problems of acrylic monomer systems. The reason why the aforesaid forms of powdered aluminum and particularly the elemental form provide superior thermal conductivity without causing spurious polymerization problems at such high concentration levels is not well understood. Without wishing to be bound to any specific theory, it may be hypothesized that the oxide layer on the aluminum particles apparently creates a barrier to the polymerization acceleration process. Moreover, powdered aluminum is unique in this respect inasmuch as other forms of elemental aluminum as well as other metals such as copper, zinc, cadmium, iron and the like produce unacceptable spurious polymerization problems.

D. The Metal Chelating Agents

It is optional, but recommended, that chelators, cross-linking agents, and inhibitors be present in the adhesive composition for optimum performance.

As noted supra, the individual particles of powdered aluminum employed in the composition of the present invention are surrounded by an oxide barrier. Notwithsanding it is deemed desirable to include a minor amount (e.g. from about 0.1 to about 1% by weight) of a metal chelating agent in the composition, i.e. to bind any free metal contamination which may be present in the atomized aluminum metal powder. The metal chelating agents may be chosen from any of those commonly known to the person reasonably skilled in the art for use in anaerobic compositions. The presently preferred metal chelating agents are ethylenediamine tetraacetic acid (EDTA), and its sodium salt, 1,1-ethylene-bis-nitril methylidyne dipyridine and the class of beta-diketones are generally the most effective and are preferred. For a more detailed discussion of these and other metal chelating agents see U.S. Pat. Nos. 4,038,475 and 4,262,106.

The inhibitor concentration left over in the monomers from manufacture is often high enough for good stability. However, to insure maximum shelf life, the proportions mentioned above (about 0.1 to about 1% by weight of the adhesive composition) are recommended. Of those inhibitors which have been found of adequate utility is the group consisting of hydroquinones, benzoquinones, naphthoquinones, phenanthraquinones, anthraquinones, and substituted compounds of any of the foregoing. Additionally, various phenols can be employed as inhibitors, the preferred one being 2,6-di-tert-butyl-4-methyl phenol.

Cross-linking agents optionally present in amounts from about zero to about 25% of the adhesive composition, include such compounds as copolymerizable dimethacrylates.

E. Other Ingredients

It is useful, but not required to incorporate an adhesion promoter into the thermally conductive adhesive system. The adhesion promotors may be chosen from any of those commonly known to the person reasonably skilled in the art. The presently preferred adhesion promoter is of the well-known silane type and may be used in proportions of about 0.5 to about 5% by weight of the composition.

Also useful, but not required is a thixotropic agent. The thixotropic agent may be chosen from any of those commonly known to the person reasonably skilled in the art. The presently preferred thixotropic agent is fumed silica ($SiO_2$). The latter is available commercially from Degussa, Inc. under the Tradename Aerosil 200. The thixotropic agent is used in sufficient quantity to produce a sufficiently high viscosity to maintain the powdered aluminum in suspension at least for the time required for the composition to gel. The amount of thixotropic agent included will depend upon the relative concentration of the powdered aluminum and viscosity of the monomer mixture. Generally the thixotropic agent will be used in amount of from about 0 to about 5% by weight of the adhesive composition.

F. Optional Ingredient

Also useful, but not required is a surface activator or primer. This latter ingredient is not included in the adhesive composition due to their extreme activity and tendency to destroy the shelf stability of the adhesive composition, but rather is separately applied to the surface of a substrate to be bonded prior to application of the adhesive composition. However, it is also feasible for the curable portion of the composition to be put on a substrate and the activator applied over it. The primer serves to drastically increase speed of cure. Two types of activators are preferred. One type comprises aldehyde-amine condensation products, the preferred being butyraldehyde-aniline. Activators of this type are sold commercially by E. I. Dupont de Nemours & Co. under the name Buetene. The condensation products are usually in a solvent solution such as trichlorethane, or similar solvents, for easy application. The other type comprises substituted thioureas as disclosed in, for example U.S. Pat. Nos. 3,591,438, 3,625,930 and 3,970,505.

The invention will now be illustrated by the following description of certain preferred embodiments thereof, given by way of example only.

EXAMPLES 1 AND 2

Table I shows two adhesive compositions containing powdered aluminum filler material and made in accordance with the instant invention.

TABLE 1

| INGREDIENTS | FORMULATION NO. | |
|---|---|---|
| | 1 | 2 |
| | Parts by Weight | |
| Hypalon 20 | 25.31 | — |
| Vamac N123 | — | 10.16 |
| HTRTH | — | 8.99 |
| Tetrahydrofurfuryl methacrylate | 54.20 | 76.46 |
| 2-hydroxyethyl methacrylate | 6.05 | 26.7 |
| Butylene glycol dimethacrylate | 0.83 | 0.68 |
| Methacrylic acid | 7.64 | — |
| 2,6 di-t-butyl-4-methyl phenol | 0.17 | 0.02 |
| Saccharin | — | 0.17 |
| Cumene hydroperoxide | 0.42 | 0.38 |
| Elemental Aluminum 101 | 100.00 | — |
| Aluminum Oxide (Alcoa C-331) | — | 122.22 |
| A | 1.90 | 4.97 |
| DER 331 | 0.83 | — |
| Aerosil 200 | 2.55 | — |
| B | — | 0.02 |
| C | — | — |
| Ethoxylated Bis Phenol A dimethacrylate | — | — |
| D | — | — |

Vamac N123 is a synthetic acrylic rubber marketed by DuPont.

Hypalon 20 is a synthetic chlorosulfonated polyethylene rubber marketed by DuPont.

HTRTH is a polyester copolymer terminated with urethane and acrylate and is formed by the reaction of toluene diisocyanate, polyethylene glycol adapate and hydroxyethyl methacrylate.

AL 101 is an elemental aluminum (metal) powder available from Aluminum Company of America (Alcoa).

Aluminum Oxide C-331 is an alumina product available from Alcoa.

A is a silane adhesive promoter.

DER 331 is an epoxy resin available from Shell Chemical Co.

B and C are EDTA chelators.

D is a phosphate chelator.

Aerosil 200 is a fumed silica product available from Degussa, Inc.

Sandlasted steel impact blocks and lap shear specimens were prepared by using as received ground steel. One drop (approximately 0.05 grams) of the activator Beutene, an amine-alydehyde-condensate manufactured by E. I. DuPont de Nemours Co. was applied to clean surfaces, and small slugs (approximately 0.2 grams each) of the polymerizable part of the adhesive compositions (Formulation Nos. 1 and 2) were applied to separate specimens. Laps and impact blocks were aligned, slight finger pressure was applied to spread the adhesive and the slugs were held under finger pressure for one-half to three minutes. Bond thickness was approximately 0.5 mils. Several such specimens of each Formulation were prepared.

The specimens were allowed to fully cure at room temperature (approximately 24 hours). The lap shears were then tested at room temperature for tensile strength. Impact blocks were tested for impact strength, and thermal conductivity. Results were as noted below.

Tensile shear strength (psi) on ground steel: 2500 to 3500 psi.

Impact strength (ft. lbs.): 10 to 14 ft. lbs./in.$^2$

Thermal conductivity $\left( K.° \text{ in } \frac{w}{m \, °C.} \text{ Determined} \right.$ $\left. \text{relative to steel at } K = 46 \frac{W}{m \, °C.} \right)$ $K = 0.55 \text{ to } 1.5 \frac{W}{m \, °C.}$ Thermal cycle test specimens were prepared using TD-220 transistors against aluminum heat sinks. One drop (approximately 0.05 grams) of Beutene amine-aldehyde-condensate activator was applied to clean aluminum specimen surfaces, and small lugs (approximately 0.2 grams each) of the adhesive compositions (Formulation Nos. 1 and 2) were applied to the transistor specimens. Specimen surfaces were aligned, slight finger pressure was applied to spread the adhesive and the specimens were held under finger pressure for thirty seconds. Bond thickness was approximately 0.5 mils. The specimens were then subjected to standard U. L. Approval Testing for Tensile Shear and Cleavage Strength under thermal cycling and humidity conditions. The results were as noted in the table below:

TABLE II

| TENSILE SHEAR TEST (% RETENTION) | | | | |
|---|---|---|---|---|
| | Formulation No. 1 | | Formulation No. 2 | |
| 40 Hr @ R.T* | 73 lb. | — | 73 lb. | — |
| 1 wk @ condensing humidity | 63 lb. | 86% | 71 lb. | 97% |
| 24 HR @ 32° F. | 69 lb. | 95% | 70 lb. | 96% |
| Cyclic** | 72 lb. | 99% | 69 lb. | 95% |
| 1000 HR @ 200° F. | 69 lb. | 95% | 71 lb. | 97% |
| 1000 HR @ 250° F. | 68 lb. | 93% | 71 lb. | 97% |
| Cleavage Test (% Retention) | | | | |
| 40 HR @ R.T.* | 14 lb. | — | 19 lb. | — |
| 1 wk @ condensing humidity | 12 lb. | 86% | 12 lb. | 63% |
| 24 HR @ 32° F. | 22 lb. | 157% | 17 lb. | 89% |
| Cyclic** | 19 lb. | 136% | 15 lb. | 79% |
| 1000 HR @ 200° F. | 30 lb. | 214% | 15 lb. | 79% |
| 1000 HR @ 250° F. | 26 lb. | 186% | 6.5 lb. | 34% |

*40 HR @ R.T. Cure preceded environmental test conditions
**24 HR @ 200° F. → 96 HR @ 100° F. → 1 wk @ 32° F.

EXAMPLES 3–6

Tables III and IV show eight adhesive compositions containing powdered aluminum filler material and made in accordance with the instant invention.

TABLE III

| | FORMULATION NO. | | | |
|---|---|---|---|---|
| INGREDIENTS | 3 | 4 | 5 | 6 |
| | Parts by Weight | | | |
| Hypalon 20 | 26.52 | — | — | — |
| Vamac N123 | — | — | — | — |
| HTRTH | — | 8.99 | 9.73 | 18.22 |
| Tetrahydrofurfuryl methacrylate | 56.79 | 80.94 | 87.60 | 27.45 |
| 2-hydroxyethyl methacrylate | 6.35 | — | — | — |
| Butylene glycol dimethacrylate | 0.87 | — | — | — |
| Methacrylic acid | 8.00 | — | — | — |
| 2,6 di-t-butyl-4-methyl phenol | 0.17 | 0.06 | 0.06 | — |
| Saccharin | — | 2.00 | 0.97 | 3.61 |
| Cumene hydroperoxide | 0.43 | 3.15 | 1.53 | 5.01 |
| Elemental Aluminum 101 | 22.22 | 100.00 | 100.00 | — |
| Aluminum Oxide (Alcoa C-331) | 100.22 | 22.22 | 300.00 | 201.84 |
| A | — | 4.29 | — | — |
| DER 331 | 0.87 | — | — | — |
| Aerosil 200 | — | — | — | — |
| B | — | 0.06 | 0.06 | 0.04 |
| C | — | — | 0.05 | 0.04 |
| Ethoxylated Bis Phenol A dimethacrylate | — | — | — | 45.46 |
| D | — | −0.51 | — | 0.59 |

TABLE IV

| | FORMULATION NO. | | | |
|---|---|---|---|---|
| INGREDIENTS | 7 | 8 | 9 | 10 |
| | Parts by Weight | | | |
| Vamac N123 | — | — | 7.52 | — |
| Acrylic Acid | — | — | — | 2.50 |
| HTRTH | 6.37 | 6.37 | — | — |
| Tetrahydrofurfuryl methacrylate | 5.11 | 5.10 | 18.60 | — |
| APH | — | — | — | 0.50 |
| Butylene glycol dimethacrylate | — | — | 0.28 | — |
| Saccharin | — | 1.11 | 1.04 | 0.50 |
| Cumene hydroperoxide | 1.75 | 1.75 | 1.38 | 1.00 |
| Elemental Aluminum 101 | — | — | — | 33.33 |
| Aluminum Oxide (C-331) | 64.67 | 65.00 | 65.00 | — |
| Dequest 2010 | 0.25 | — | — | 0.02 |
| Aerosil 200 | 0.35 | — | — | — |
| 2,6 di-t-butyl-4-methyl phenol | 0.02 | 0.02 | 0.02 | 2.37 |
| E | — | — | — | 0.12 |
| Ethoxylated Bis Phenol A dimethacrylate | 15.26 | 15.31 | 0.07 | 58.39 |
| D | — | 0.22 | — | — |
| Hydroxy Propyl Methacrylate | 5.11 | 5.10 | 6.10 | — |

APH is a curing agent.
E is a radiation inhibitor.

Lap shear specimens were prepared as before, specimens allowed to cure at room temperature, and the lap shears were then tested as before. Results were as before.

As will be appreciated, the foregoing invention provides novel and improved thermally conductive adhesive systems. The adhesive systems have the ability to cure through large gaps. Moreover, the cured adhesives have excellent resistance to thermal cycling and exhibit good thermal conductivity. The cured coatings have excellent adherence to plastics, metal, glass and wood and are hydrolytically stable.

The invention has been described particularly with application to thermal conductive applications. However, one skilled in the art will appreciate that the adhesive systems are not limited to use as thermally conductive adhesives, but may be employed as structural adhesives in any industrial area where adhesive bonding is desired. The powdered aluminum filler material provides a reinforcing material in the adhesive compositions of the instant invention which produces an extremely tough adhesive. The adhesive compositions of the present invention also may be advantageously employed as machinable fillers. Also, ultraviolet ("uv") initiators could be included in the adhesive compositions when particularly fast fixture time is required. Still other changes will be obvious to one skilled in the art.

We claim:

1. In a method of bonding to surfaces using an anaerobic adhesive composition wherein said adhesive composition is applied to at least one of said surfaces, and the surfaces are placed in abutting relationship under conditions which promote curing of said adhesive composition, wherein said adhesive comprises at least one polymerizable acrylic monomer system, and an effective amount for initiation of a free radical initiator, the improvement wherein said adhesive composition also comprises high purity powdered aluminum filler material selected from the group consisting of anhydrous alumina, elemental (atomized) aluminum metal powder and mixtures of elemental (atomized) aluminum metal powder and powdered alumina, in an amount in the range from about 30% to about 80% by weight of the total composition, said adhesive composition, in uncured state, exhibiting good shelf stability and, when cured, exhibiting good thermal conductivity and adhesive strength at elevated temperatures, enhanced resistance to thermal cycling, and good dielectric properties.

2. A method according to claim 1, including the step of applying an activator to one or both surfaces to promote polymerization of said monomer system.

3. A method according to claim 1, including the step of applying an activator to said applied composition to promote polymerization of said monomer system.

4. A method according to claim 1, wherein said monomer system is cured by the exclusion of oxygen.

5. A method according to claim 1, wherein said powdered aluminum filler material is present in an amount in the range of from about 40 to about 70% by weight of the total composition.

6. A method according to claim 5, wherein said powdered aluminum filler material comprises elemental (atomized) aluminum metal powder.

7. A method according to claim 6, including the step of deriving said elemental aluminum by high pressure ejection of molten aluminum into hot air or steam.

8. A method according to claim 6, wherein said aluminum metal powder comprises generally spherical particles of average particle diameter of 17 to 24 microns.

9. A method according to claim 5, wherein said powdered aluminum filler comprises powdered alumina.

10. A method according to claim 4, including the step of partially or wholly dehydrating said powdered alumina.

11. A method according to claim 1, and including the step of adding at least one rubber or cure to rubber compound in said adhesive composition.

12. A method according to claim 11, wherein said rubber or cure to rubber compound comprises about 5 to about 50% by weight of said monomer system.

13. A method according to claim 12, wherein said rubber or cure to rubber compound comprises about 5 to about 40% by weight of said monomer system.

14. A method according to claim 11, wherein said rubber or cure to rubber compound comprises an acrylic rubber.

15. A method according to claim 11, wherein said rubber or cure to rubber compound comprises a chlorosulfonated polyethylene.

16. A method according to claim 1, wherein said free radical initiator comprises an organic peroxide compound.

17. A method according to claim 1, wherein said free radical initiator comprises an organic perester compound.

18. A method according to claim 1, wherein said free radical initiator comprises an organic hydroperoxide compound.

19. A method according to claim 1, wherein said powdered aluminum filler material comprises a mixture of alumina and elemental aluminum.

20. A method according to claim 2, wherein said powdered aluminum filler material comprises a mixture of alumina and elemental aluminum.

21. A method according to claim 1, and including the step of adding a metal chelator to sid adhesive composition.

22. A method according to claim 1, and including the step of adding a thixotropic agent to said adhesive composition.

23. A method according to claim 1, and including the step of adding saccharin to said adhesive composition.

24. A method according to claim 1, wherein said polymerizable acrylic monomer system comprises an acrylate ester monomer.

* * * * *